(12) United States Patent
Zhang et al.

(10) Patent No.: US 11,598,498 B2
(45) Date of Patent: Mar. 7, 2023

(54) LIGHT BAR, METHOD FOR FABRICATING SAME, AND DISPLAY APPARATUS

(71) Applicants: Beijing BOE Optoelectronics Technology Co., Ltd., Beijing (CN); BOE Technology Group Co., Ltd., Beijing (CN)

(72) Inventors: Gongtao Zhang, Beijing (CN); Junjie Ma, Beijing (CN); Haiwei Sun, Beijing (CN); Jian Sang, Beijing (CN); Shipeng Wang, Beijing (CN)

(73) Assignees: BEIJING BOE OPTOELECTRONICS TECHNOLOGY CO., LTD, Beijing (CN); BOE TECHNOLOGY GROUP CO., LTD, Beijing (CN)

( * ) Notice: Subject to any disclaimer, the term of this patent is extended or adjusted under 35 U.S.C. 154(b) by 175 days.

(21) Appl. No.: 16/549,196

(22) Filed: Aug. 23, 2019

(65) Prior Publication Data
US 2020/0063926 A1 Feb. 27, 2020

(30) Foreign Application Priority Data
Aug. 24, 2018 (CN) .......................... 201810978329.3

(51) Int. Cl.
F21S 4/28 (2016.01)
F21V 19/00 (2006.01)
(Continued)

(52) U.S. Cl.
CPC ................. *F21S 4/28* (2016.01); *F21K 9/90* (2013.01); *F21V 19/00* (2013.01); *H01L 25/0753* (2013.01); *H01L 33/50* (2013.01)

(58) Field of Classification Search
CPC ... H01L 25/075–0753; H01L 33/50–60; F21K 9/90
See application file for complete search history.

(56) References Cited

U.S. PATENT DOCUMENTS 9,847,445 B2 * 12/2017 Wei ..................... H01L 33/0095
10,203,448 B1 2/2019 Li
(Continued)

FOREIGN PATENT DOCUMENTS

CN 101477774 A 7/2009
CN 102478174 A 5/2012
(Continued)

OTHER PUBLICATIONS

First office action of Chinese application No. 201810978329.3 dated Jul. 8, 2020.
(Continued)

Primary Examiner — Mariceli Santiago
(74) Attorney, Agent, or Firm — Lippes Mathias LLP

(57) ABSTRACT

The present disclosure provides a light bar, a method for fabricating the same, and a display apparatus, in the field of display technologies. The method includes: fabricating a plurality of light emitting units; determining a target group of light emitting units in the plurality of light emitting units based on luminescent characteristics of the plurality of light emitting units, the target group of light emitting units including a portion of light emitting units in the plurality of light emitting units; and disposing at least two light emitting units in the target group of light emitting units on a printed circuit board to obtain the light bar.

5 Claims, 10 Drawing Sheets

(51) Int. Cl.
    *H01L 33/50*         (2010.01)
    *H01L 25/075*      (2006.01)
    *F21K 9/90*          (2016.01)

(56)              References Cited

U.S. PATENT DOCUMENTS

| | | | |
|---|---|---|---|
| 10,424,703 B2* | 9/2019 | Ooyabu | H01L 33/46 |
| 10,784,423 B2* | 9/2020 | Hung | H01L 33/62 |
| 2006/0169994 A1* | 8/2006 | Tu | H01L 33/36 |
| | | | 257/89 |
| 2008/0007509 A1* | 1/2008 | Lankhorst | G02F 1/133603 |
| | | | 345/102 |
| 2015/0311405 A1 | 10/2015 | Oyamada et al. | |
| 2016/0057833 A1 | 2/2016 | Oh et al. | |
| 2018/0175239 A1 | 6/2018 | Hayashi | |

FOREIGN PATENT DOCUMENTS

| | | | |
|---|---|---|---|
| CN | 103680340 A | * | 3/2014 |
| CN | 104854716 A | | 8/2015 |
| CN | 107134522 A | | 9/2017 |
| CN | 107331678 A | | 11/2017 |
| CN | 107507904 A | | 12/2017 |
| CN | 207162204 U | | 3/2018 |
| CN | 108231974 A | | 6/2018 |

OTHER PUBLICATIONS

Second office action of Chinese application No. 201810978329.3 dated Dec. 8, 2020.

* cited by examiner

LIGHT BAR, METHOD FOR FABRICATING SAME, AND DISPLAY APPARATUS

This application claims priority to Chinese Patent Application No. 201810978329.3, filed on Aug. 24, 2018 and entitled "LIGHT BAR, METHOD FOR FABRICATING SAME, AND DISPLAY APPARATUS", the entire contents of which are incorporated herein by reference.

TECHNICAL FIELD

The present disclosure relates to the field of display technologies, and particularly to a light bar, a method for fabricating the same, and a display apparatus.

BACKGROUND

With the development of science and technology, display apparatuses are more and more widely used. A display apparatus includes a backlight module, which includes a light bar.

A light bar includes a printed circuit board, a plurality of light beads disposed on the printed circuit board, and a fluorescent film covering the plurality of light beads. Where the light bar needs to be controlled to emit light, power may be applied by the printed circuit board to the plurality of light beads such that the plurality of light beads emit light to the fluorescent film, and hence the fluorescent film is excited to emit light to the light bar.

SUMMARY

The present disclosure provides a light bar, a method for fabricating the same, and a display apparatus. The technical solutions are as follows.

In an aspect, there is provided a method for fabricating a light bar, comprising: fabricating a plurality of light emitting units; determining a target group of light emitting units in the plurality of light emitting units based on luminescent characteristics of the plurality of light emitting units, the target group of light emitting units comprising a portion of light emitting units in the plurality of light emitting units; and disposing at least two light emitting units in the target group of light emitting units on a printed circuit board to obtain a light bar.

Optionally, the target group of light emitting units satisfy: $|P1_i - P2_i| \leq Q_i$, $P1_i$ denoting an $i^{th}$ parameter in n parameters that one light emitting unit in the target group of light emitting units corresponds to, $1 \leq i \leq n$, $P2_i$ denoting an $i^{th}$ parameter in n parameters that another light emitting unit in the target group of light emitting units corresponds to, and $Q_i$ denoting a threshold of the $i^{th}$ parameter; wherein the n parameters that the light emitting unit corresponds to comprise: at least one parameter of light emitted by at least one target structure under a target voltage, the target structure comprising at least one light emitting portion in the light emitting unit.

Optionally, the n parameters comprise at least one of: chrominance, luminance and wavelength band.

Optionally, the light emitting unit comprises: a light bead and a fluorescent film covering the light bead, the light bead and the fluorescent film being both the light emitting portions in the light emitting unit; and the at least one target structure comprises: a first target structure comprising the light bead and the fluorescent film, and a second target structure comprising the light bead; and wherein the n parameters that the light emitting unit corresponds to comprise: chrominance and luminance of light emitted by the first target structure under the target voltage, and wavelength band of light emitted by the first target structure or the second target structure under the target voltage.

Optionally, the fabricating a plurality of light emitting units comprises: forming an initial structure on a substrate, the initial structure comprising a plurality of light beads that are spaced apart from each other, and a fluorescent layer covering the plurality of light beads; and cutting the initial structure into the plurality of light emitting units, wherein the light emitting unit comprises one of the light beads and a fluorescent film, the fluorescent film comprising a portion covering the one light bead in the fluorescent layer, the light bead and the fluorescent film being both the light emitting portions in the light emitting unit.

Optionally, the forming an initial structure on a substrate comprises: forming the plurality of light beads on the substrate; injecting fluorescent melt on a side where the plurality of light beads are on the substrate; and thermally curing the fluorescent melt to form the fluorescent layer; wherein the substrate comprises a substrate body and a thermally-conductive adhesive tape that are superimposed, the plurality of light beads being on a side of the thermally-conductive adhesive tape away from the substrate body.

Optionally, an included angle between a surface of any light emitting unit facing towards other light emitting units and the printed circuit board is less than 90 degrees, the other light emitting units comprising light emitting units in the light bar other than the any light emitting unit.

Optionally, the cutting the initial structure into the plurality of light emitting units comprises: rotating the initial structure on the substrate such that the fluorescent film in the initial structure is near the substrate; cutting the rotated initial structure into the plurality of light emitting units with a cutting tool, the cutting tool being in a sheet shape, and the cutting tool having a progressively increasing thickness in a direction from a cutting edge to a spin of the cutting tool; the disposing at least two light emitting units in the target group of light emitting units on a printed circuit board to obtain a light bar comprises: rotarily disposing the at least two light emitting units in the target group of light emitting units the printed circuit board to obtain the light bar, the light beads in the light bar being near the printed circuit boards.

Optionally, after disposing at least two light emitting units in the target group of light emitting units on a printed circuit board, the method further comprises: forming an insulating isolation structure between any two adjacent light emitting units in the light bar.

Optionally, the fabricating a plurality of light emitting units comprises: forming a plurality of light beads on a substrate, the substrate comprising a substrate body and a thermally-conductive adhesive tape that are superimposed, and the plurality of light beads being on a side of the thermally-conductive adhesive tape away from the substrate body; injecting fluorescent melt on a side where the plurality of light beads are on the substrate; thermally curing the fluorescent melt to form a fluorescent layer covering the plurality of light beads; and cutting the initial structure into the plurality of light emitting units; after disposing at least two light emitting units in the target group of light emitting units on a printed circuit board, the method further comprises: forming an insulating isolation structure between any two adjacent light emitting units in the light bar.

In another aspect, there is provided a light bar, which is fabricated by using the above method for fabricating a light bar. The light bar comprises: a printed circuit board, and at least two light emitting units on the printed circuit board;

wherein the at least two light emitting units satisfy $|P1_i-P2_i|\leq Q_i$, $P1_i$ denoting an $i^{th}$ parameter in n parameters that one light emitting unit in the light bar corresponds to, $1\leq i\leq n$, $P2_i$ denoting an $i^{th}$ parameter in parameters that another light emitting unit in the light bar corresponds to, and $Q_i$ denoting a threshold of the $i^{th}$ parameter; and wherein the n parameters that the light emitting unit corresponds to comprise: at least one parameter of light emitted by at least one target structure under a target voltage, the target structure comprising at least one light emitting portion in the light emitting unit.

Optionally, the n parameters comprise at least one of chrominance, luminance and wavelength band.

Optionally, the light emitting unit comprises: a light bead and a fluorescent film covering the light bead, the light bead and the fluorescent film being both the light emitting portions in the light emitting unit; and the at least one target structure comprises: a first target structure comprising the light bead and the fluorescent film, and a second target structure comprising the light bead; and wherein the n parameters that the light emitting unit corresponds to comprise: chrominance and luminance of light emitted by the first target structure under the target voltage, and wavelength band of light emitted by the first target structure or the second target structure under the target voltage.

Optionally, a spacing between any two light emitting units in the light bar is less than or equal to 0.3 mm.

Optionally, in the light bar, a surface of any light emitting unit facing towards other light emitting units is perpendicular to the printed circuit board, the other light emitting units comprising light emitting units in the light bar other than the any light emitting unit.

Optionally, in the light bar, an included angle between a surface of any light emitting unit facing towards other light emitting units and the printed circuit board is less than 90 degrees, the other light emitting units comprising light emitting units in the light bar other than the any light emitting unit.

Optionally, in the light bar, the surface of any light emitting unit facing towards other light emitting units faces towards a direction away from the printed circuit board.

Optionally, an insulating isolation structure is between any two adjacent light emitting units in the light bar.

Optionally, a material of the isolation structure may include at least one of silica gel and titanium dioxide.

Optionally, a surface of the isolation structure facing towards any light emitting unit is a reflection surface.

Optionally, a spacing between any two light emitting units in the light bar is less than or equal to 0.3 mm; in the light bar, a surface of any light emitting unit facing towards other light emitting units is perpendicular to the printed circuit board, the other light emitting units comprising light emitting units in the light bar other than the any light emitting unit; or in the light bar, an included angle between a surface of any light emitting unit facing towards other light emitting units and the printed circuit board is less than 90 degrees; and an insulating isolation structure is between any two adjacent light emitting units in the light bar, a surface of the isolation structure facing towards any light emitting unit being a reflection surface.

In yet another aspect, there is provided a display apparatus, comprising the above light bar.

It is to be understood that both the foregoing general description and the following detailed description are exemplary and explanatory only and are intended to limit the present disclosure.

DETAILED DESCRIPTION

In order to describe the principles, technical solutions and advantages in the present more clearly, the present disclosure will be described in detail below with reference to the accompanying drawings. Apparently, the described embodiments are merely some embodiments, rather than all embodiments, of the present disclosure. Based on the embodiments of the present disclosure, all other embodiments derived by a person of ordinary skill in the art without creative efforts shall fall within the protection scope of the present disclosure.

A light bar includes a printed circuit board, a plurality of light beads on the printed circuit board, and a fluorescent film covering the plurality of light beads. Since the fluorescent film has a poor thickness uniformity, when power is applied to the plurality of light beads by the printed circuit board such that the plurality of light beads emit light to the fluorescent film to excite the fluorescent film to emit light towards the outside of the light bar, light emitted by the portions covering different light beads of the fluorescent film is greatly different, such that the light emitted by the entire light bar has a poor uniformity. Embodiments of the present disclosure provide a method for fabricating a light bar. Light emitted by a light bar fabricated by using this method has a good uniformity.

Figure 1:
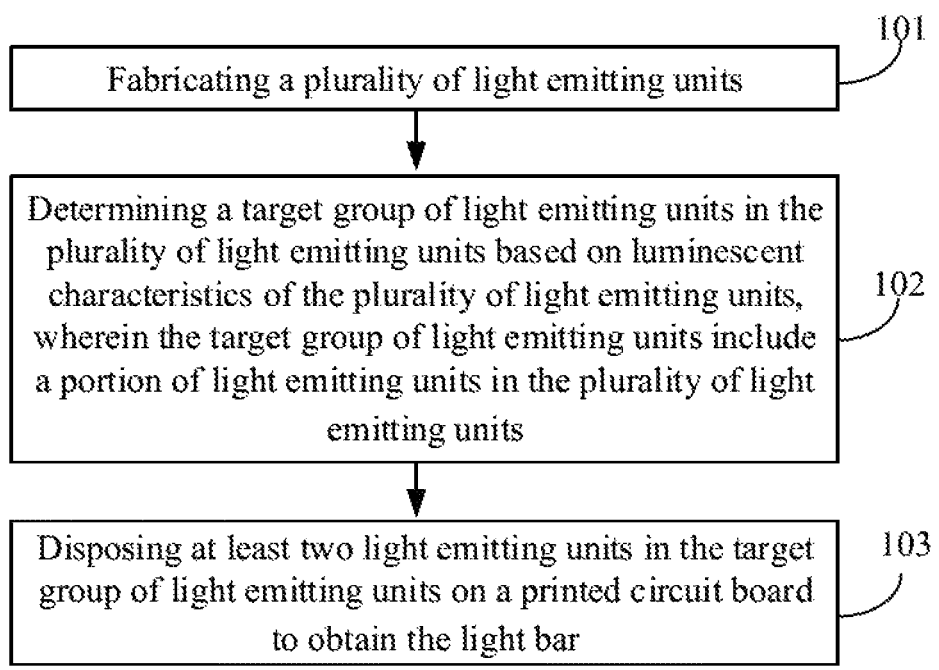
FIG. 1 is a flowchart of a method for fabricating a light bar according to an embodiment of the present disclosure.

FIG. 1 is a flowchart of a method for fabricating a light bar according to an embodiment of the present disclosure. As illustrated in FIG. 1, the method may include the following steps.

In step 101, a plurality of light emitting units are fabricated.

In step 102, a target group of light emitting units in the plurality of light emitting units are determined based on luminescent characteristics of the plurality of light emitting units, wherein the target group of light emitting units include a portion of light emitting units in the plurality of light emitting units.

In step 103, at least two light emitting units in the target group of light emitting units are disposed on a printed circuit board to obtain the light bar.

In summary, during fabrication of a light bar in the related art, after a plurality of light emitting units are fabricated, the plurality of light emitting units are directly disposed on a printed circuit board, without selecting a target group of light emitting units from the plurality of light emitting units based on the luminescent characteristics of the plurality of light emitting units. However, in the method according to the embodiment of the present disclosure, after a plurality of light emitting units are fabricated, a target group of light emitting units are determined based on the luminescent characteristics of the plurality of light emitting units. In this way, the method according to the present disclosure is different from the method in the related art, which enriches the fabrication methods of light bars.

Optionally, the target group of light emitting units determined based on the luminescent characteristics of the plurality of light emitting units satisfy $|P1_i-P2_i| \leq Q_i$. $P1_i$ denotes an $i^{th}$ parameter in n parameters that one light emitting unit in the target group of light emitting units corresponds to, $1 \leq i \leq n$, $P2_i$ denotes an $i^{th}$ parameter in parameters that another light emitting unit in the target group of light emitting units corresponds to, and $Q_i$ denotes a threshold of the $i^{th}$ parameter. The n parameters that the light emitting unit corresponds to include: at least one parameter of light emitted by at least one target structure under a target voltage. The target structure includes at least one light emitting portion in the light emitting unit.

It should be noted that the light emitting unit may include one or a plurality of light emitting portions, and the above-described target structure may include at least one light emitting portion in the light emitting unit. Exemplarily, the target structure may include all the light emitting portions in the light emitting unit. Still exemplarily, the target structure may include some of the light emitting portions in the light emitting unit, which is not limited in the embodiment of the present disclosure.

When the target group of light emitting units satisfy the condition $|P1_i-P2_i| \leq Q_i$, light emitted by the light emitting units in the target group of light emitting units has a small difference. Therefore, after a plurality of light emitting units in the target group of light emitting units are disposed on a printed circuit board, light emitted by any two light emitting units on the printed circuit board has a small difference, and thus the light bar where the printed circuit board is disposed achieves a better luminescence effect.

Figure 2:
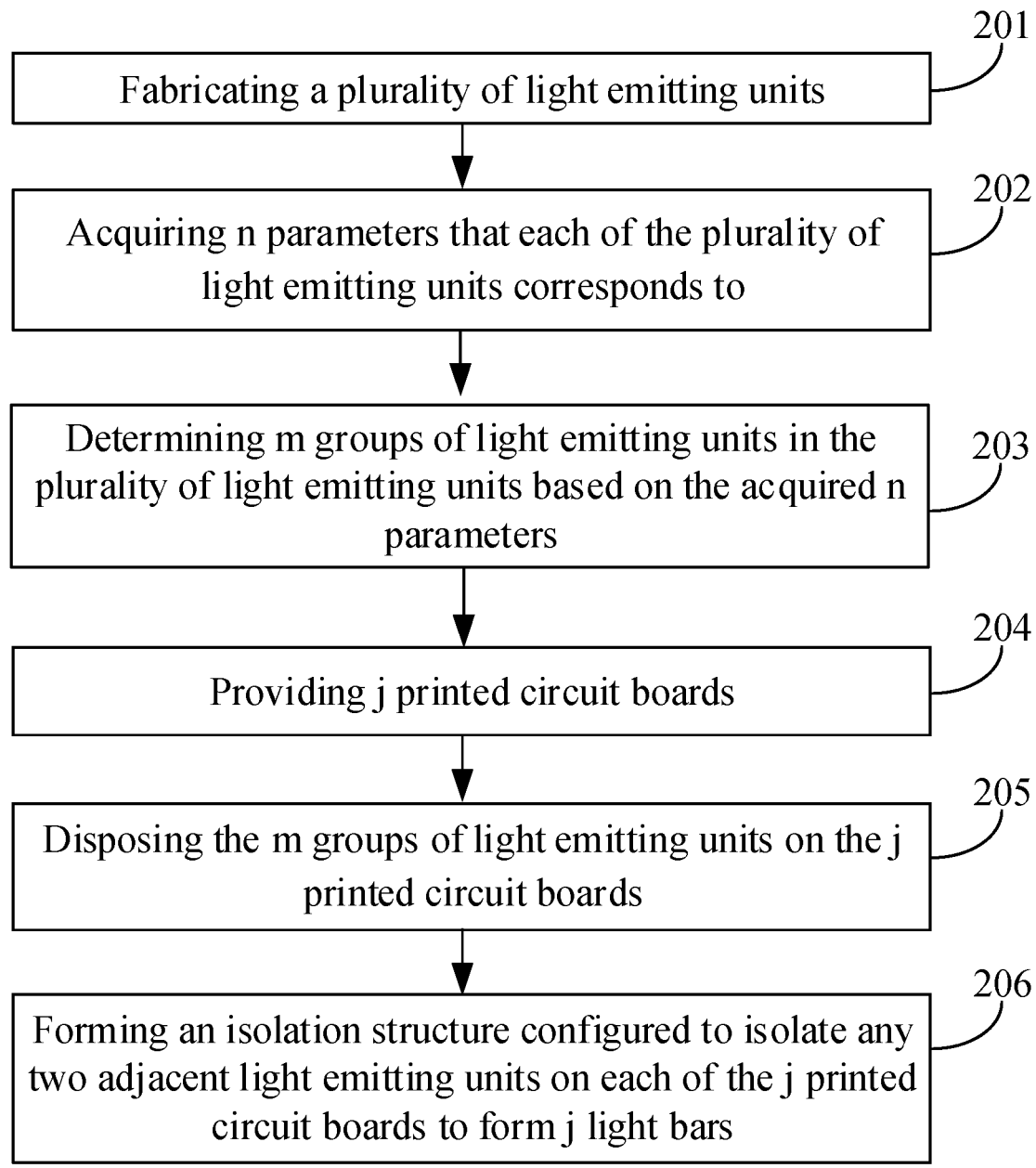
FIG. 2 is a flowchart of another method for fabricating a light bar according to an embodiment of the present disclosure.

FIG. 2 is a flowchart of another method for fabricating a light bar according to an embodiment of the present disclosure. As illustrated in FIG. 2, the method may include the following steps.

In step 201, a plurality of light emitting units are fabricated.

Figure 3:
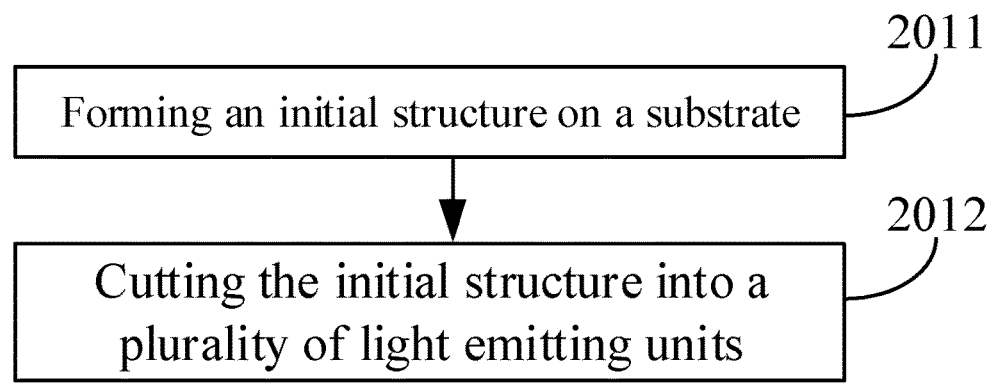
FIG. 3 is a flowchart of a method for fabricating a plurality of light emitting units according to an embodiment of the present disclosure.

As illustrated in FIG. 3, step 201 may include the following steps.

In step 2011, an initial structure is formed on a substrate.

Figure 4:
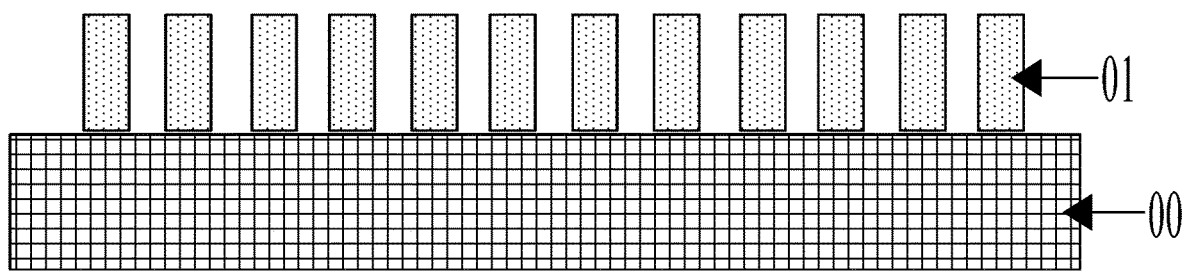
FIG. 4 is a schematic diagram of a positional relationship between a blue film and a plurality of light beads according to an embodiment of the present disclosure.
Figure 5:
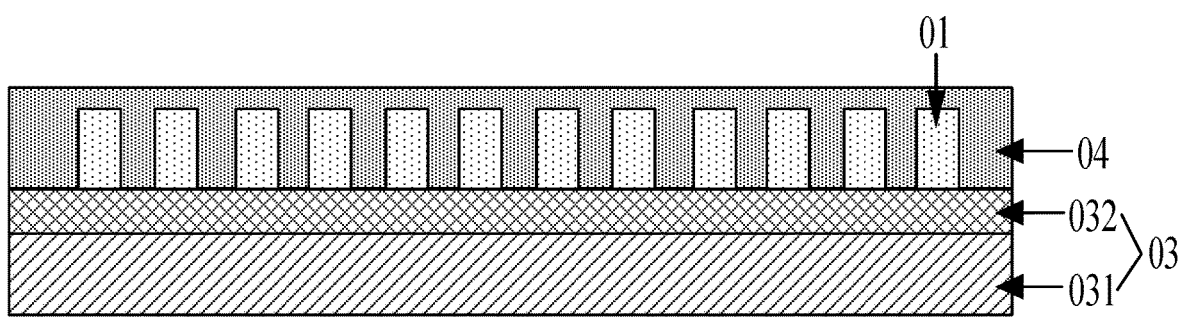
FIG. 5 is a schematic diagram of an initial structure according to an embodiment of the present disclosure.

Exemplarily, as illustrated in FIG. 4, a plurality of light beads 01 may be formed on a blue film 00 first. Subsequently, the plurality of light beads 01 on the blue film 00 may be transferred to a substrate 03 as illustrated in FIG. 5, and the plurality of light beads 01 may be spaced apart from each other on the substrate 03. Afterwards, a fluorescent layer 04 for covering the plurality of light beads 01 is formed on the substrate 03, to form an initial structure including the plurality of light beads 01 and the fluorescent layer 04 on the substrate 03.

During the process of forming the fluorescent layer 04 on the substrate 03, fluorescent melt may be injected onto the plurality of light beads 01, and then the fluorescent melt is thermally cured to form the fluorescent layer 04.

Optionally, the substrate 03 may include a substrate body 031 and a thermally-conductive adhesive tape 032 that are superimposed. The initial structure may be on a side of the thermally-conductive adhesive tape 032 away from the substrate body 031. In addition, during the process of thermally curing the fluorescent melt, the thermally-conductive adhesive tape 032 may accelerate thermal curing of the fluorescent melt, such that the initial structure may be quickly formed.

It should be noted that the embodiment of the present disclosure is described by taking an example where a plurality of light beads are first formed on the blue film during the process of forming the initial structure on the substrate, and then the plurality of light beads are transferred to the substrate where the thermally-conductive adhesive tape is disposed. Optionally, during the process of forming the initial structure on the substrate, a plurality of light beads may be directly formed on the substrate, and the substrate does not include a thermally-conductive adhesive tape, which is not limited in the embodiment of the present disclosure.

In step 2012, the initial structure is cut into a plurality of light emitting units.

Figure 6:
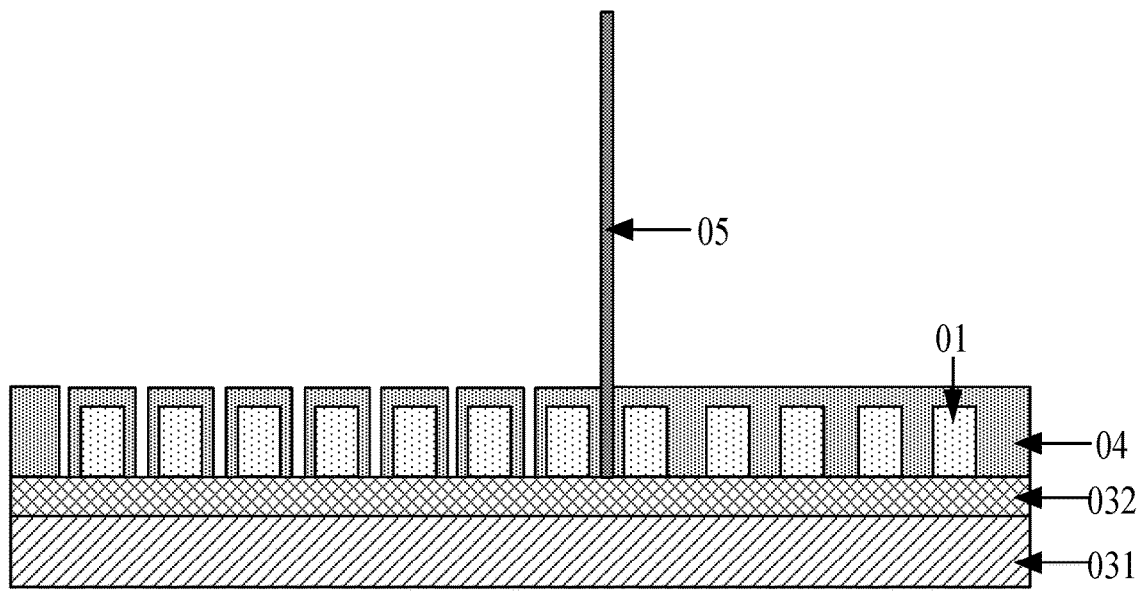
FIG. 6 is a schematic diagram of a positional relationship between a cutting tool and an initial structure according to an embodiment of the present disclosure.
Figure 7:
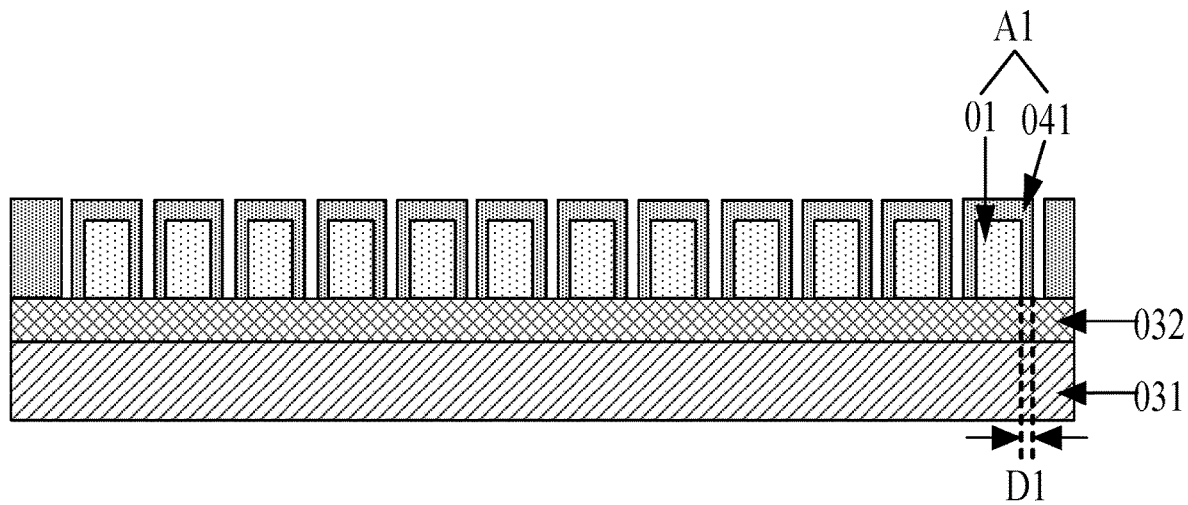
FIG. 7 is a schematic diagram of a positional relationship between a substrate and a plurality of light emitting units according to an embodiment of the present disclosure.

Exemplarily, as illustrated in FIG. 6, in step 2012, the initial structure may be cut by using a cutting tool 05 (not illustrated in FIG. 6), such that the initial structure is cut into a plurality of light emitting units A1 as illustrated in FIG. 7. Each light emitting unit A may include a light bead 0 and a fluorescent film 041. The fluorescent film 041 includes a portion covering the light bead 1 of a fluorescent film (not illustrated in FIG. 7).

Optionally, to ensure that the fluorescent film 041 effectively covers the light bead 01, in each light emitting unit A1, a minimum distance D1 between a side surface (not illustrated in FIG. 7) of the fluorescent film 041 and a side surface (not illustrated in FIG. 7) of the light bead 01 may be greater than or equal to 0.1 mm. The side surface of the fluorescent film 041 and the side surface of the light bead 01 both face towards a direction parallel to the printed circuit board. Optionally, the minimum distance D1 may also be greater than or equal to another distance (for example, 0.11 mm), which is not limited in the embodiment of the present disclosure.

It should be noted that the embodiment of the present disclosure is described by taking an example where during the process of cutting the initial structure, a cross section (perpendicular to the printed circuit board) of the used cutting tool and a cross section (perpendicular to the printed circuit board) of the cut light emitting unit are both in a rectangular shape. Optionally, during the process of cutting the initial structure, the cross section of the used cutting tool may be in another shape (for example, an inverted triangular shape), and the cross section of the cut light emitting unit may be in another shape (for example, a trapezoid shape), which is not limited in the embodiment of the present disclosure.

In step 202, n parameters that each of the plurality of light emitting units corresponds to are acquired.

Exemplarily, in step 202, a target voltage may be applied to each of the plurality of light emitting units A1 as illustrated in FIG. 7, and n parameters that each light emitting unit A1 corresponds to are acquired. The n parameters that the light emitting unit A1 corresponds to include: at least one parameter of light emitted by at least one target structure under a target voltage. The target structure includes at least one light emitting portion in the light emitting unit.

Optionally, the n parameters include: at least one parameter of chrominance, luminance or wavelength band. The chrominance may be chrominance coordinates (x, y) in the 1931 chrominance coordinates (also referred to as CIE1931 chrominance coordinates) specified by the International Commission on Illumination. Here, x denotes a red component in the chrominance coordinates, and y denotes a green component in the chrominance coordinates, and the unit of the luminance may be lumen.

Optionally, the light emitting unit in the embodiment of the present may include a light bead and a fluorescent film covering the light bead. The light bead and the fluorescent film are the light emitting portions in the light emitting unit. The at least one target structure described above includes a first target structure including the light bead and the fluorescent film, and a second target structure including the light bead. In this case, the n parameters that the light emitting unit corresponds to include: chrominance and luminance of light emitted by the first target structure under the target voltage, and wavelength band of light emitted by the first target structure or the second target structure under the target voltage.

In step 203, m groups of light emitting units in the plurality of light emitting units are determined based on the acquired n parameters.

Optionally, the number of light emitting units in each group of light emitting units is greater than or equal to a predetermined number. The n parameters adopted in step 203 may be used to reflect the luminescent characteristics of the light emitting unit.

Each group of light emitting units in the m groups of light emitting units may be referred to as a target group of light emitting units. The target group of light emitting units satisfy $|P1_i-P2_i| \leq Q_i$. Here, $P1_i$ denotes an $i^{th}$ parameter in n parameters that one light emitting unit in the target group of light emitting units corresponds to, $1 \leq i \leq n$, $P2_i$ denotes an $i^{th}$ parameter in parameters that another light emitting unit in the target group of light emitting units corresponds to, and $Q_i$ denotes a threshold of the $i^{th}$ parameter.

Exemplarily, when the n parameters include chrominance, luminance and wavelength band, the threshold of the chrominance may be 0.005. In this case, in each group of light emitting units, an absolute value of a difference between the chrominance of light emitted by any two light emitting units under the same voltage may be less than or equal to 0.005. The threshold of the luminance may be 0.25. In this case, in each group of light emitting units, an absolute value of a difference between luminance that any two light emitting units correspond to may be less than or equal to 0.25. The threshold of the wavelength band may be any value from 1 nm to 2 nm (for example, 1.5 nm). In this case, in each group of light emitting units, an absolute value of a difference between luminance that any two light emitting units correspond to may be less than or equal to the threshold of the wavelength band.

Exemplarily, the same group of light emitting units may include two light emitting units with chrominance coordinates of (0.281, 0.282) and (0.285, 0.287) respectively, and the same group of light emitting units may further include two light emitting units with lumens of 7 and 7.25 respectively. Optionally, the same group of light emitting units may further include two light emitting units with other chrominance coordinates (for example, the chrominance coordinates of (0.283, 0.284) and (0.2856, 0.287) respectively), and the same group of light emitting units may further include two light emitting units with other luminance (for example, the luminance of 7.11 lumens and 7.23 lumens respectively), which is not limited in the embodiment of the present disclosure.

It should be noted that the embodiment is described only by taking an example where the n parameters include the chrominance, luminance and wavelength band, and the threshold of the chrominance is 0.005, the threshold of the luminance is 0.25 and the threshold of the wavelength band is from 1 nm to 2 nm. Optionally, the n parameters may include more than three (for example, four) parameters, the threshold of the chrominance may also be another value (for example, 0.004), the threshold of the luminance may also be another value (for example, 0.21), and the threshold of the wavelength band may also be another value (for example, 3 nm), which are not limited in the embodiment of the present disclosure.

In step 204, j printed circuit boards are provided.

Here, m≤j.

In step 205, the m groups of light emitting units are disposed on the j printed circuit boards.

In step 205, the plurality of light emitting units in each group of light emitting units in the m groups of light emitting units may be disposed on one printed circuit board in the j printed circuit boards, and the light emitting units disposed on each printed circuit board belong to the same group of light emitting units.

Figure 8:
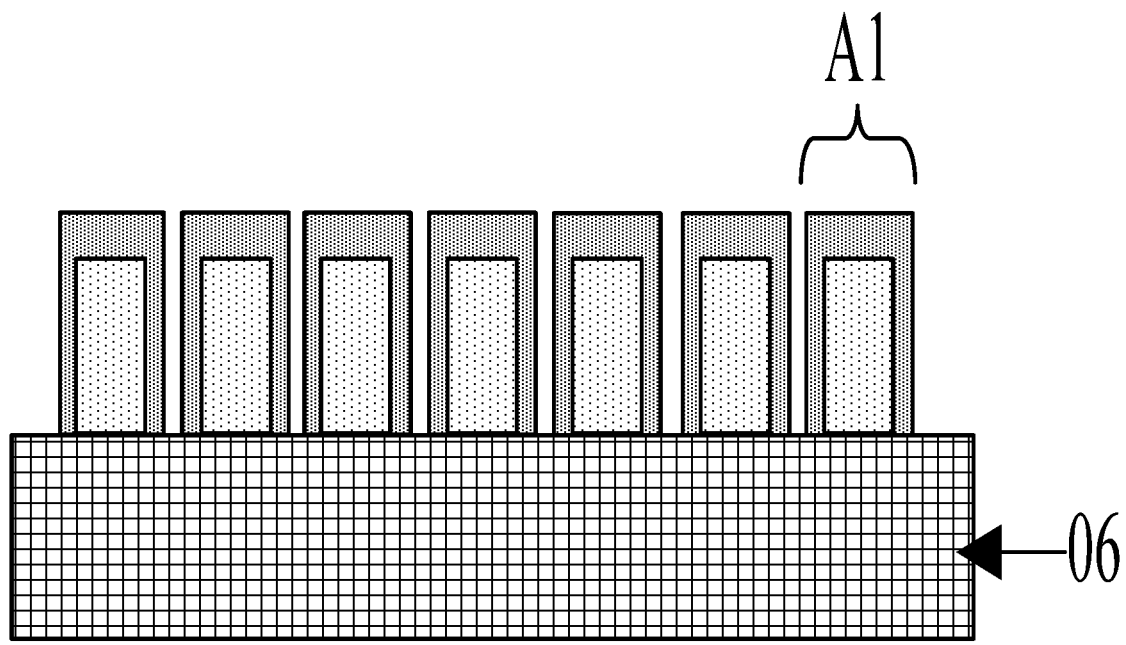
FIG. 8 is a schematic diagram of a positional relationship between a blue film and a plurality of light emitting units according to an embodiment of the present disclosure.
Figure 9:
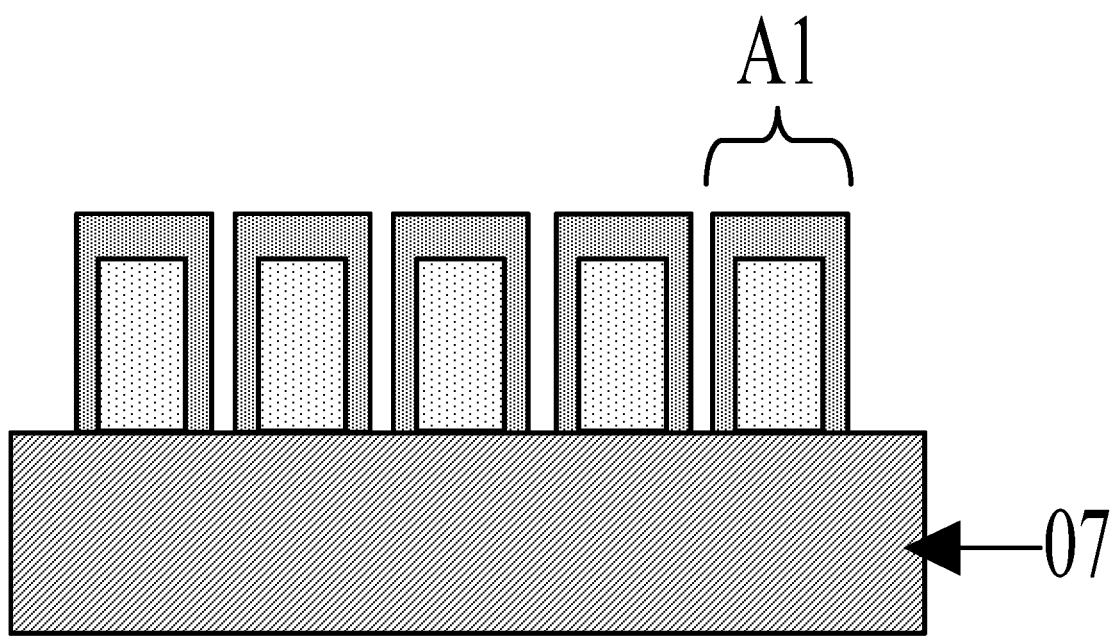
FIG. 9 is a schematic diagram of structures of a printed circuit board and a plurality of light emitting units according to an embodiment of the present disclosure.

Exemplarily, still referring to FIG. 7, during transferring the plurality of light emitting units A1 from the substrate 03 to a printed circuit board, these light emitting units A1 may be first transferred from the substrate 03 to a blue film 06 as illustrated in FIG. 8. Afterwards, these light emitting units A1 are transferred from the blue film 06 to a printed circuit board 07 as illustrated in FIG. 9, and these light emitting units A1 are arranged in sequence on the printed circuit board 07. In addition, these light emitting units A1 are spaced apart from each other on the printed circuit board 07.

It should be noted that the embodiment of the present disclosure is described only by taking an example where during the process of disposing the light emitting units on the printed circuit board, the light emitting units are first transferred from the substrate to the blue film, and then transferred from the blue film to the printed circuit board. Optionally, during the process of disposing the light emitting units on the printed circuit board, the light emitting units may be directly transferred from the substrate to the printed circuit board, which is not limited in the embodiment of the present disclosure.

The embodiment of the present disclosure is described only by taking an example where during the process of transferring the light emitting units from the substrate to the printed circuit board via the blue film, a group of light emitting units are first transferred from the substrate to the blue film, and then a portion of light emitting units in the group of light emitting units are transferred from the printed circuit board. Optionally, after a group of light emitting units are transferred from the substrate to the blue film, all of this group of light emitting units may also be transferred to the printed circuit board. In addition, during the process of transferring the light emitting units on the substrate to the blue film, all of the m groups of light emitting units on the substrate may also be transferred to the blue film, which is not limited in the embodiment of the present disclosure.

In step 206, an isolation structure configured to isolate any two adjacent light emitting units is formed on each of the j printed circuit boards to form j light bars.

Figure 10:
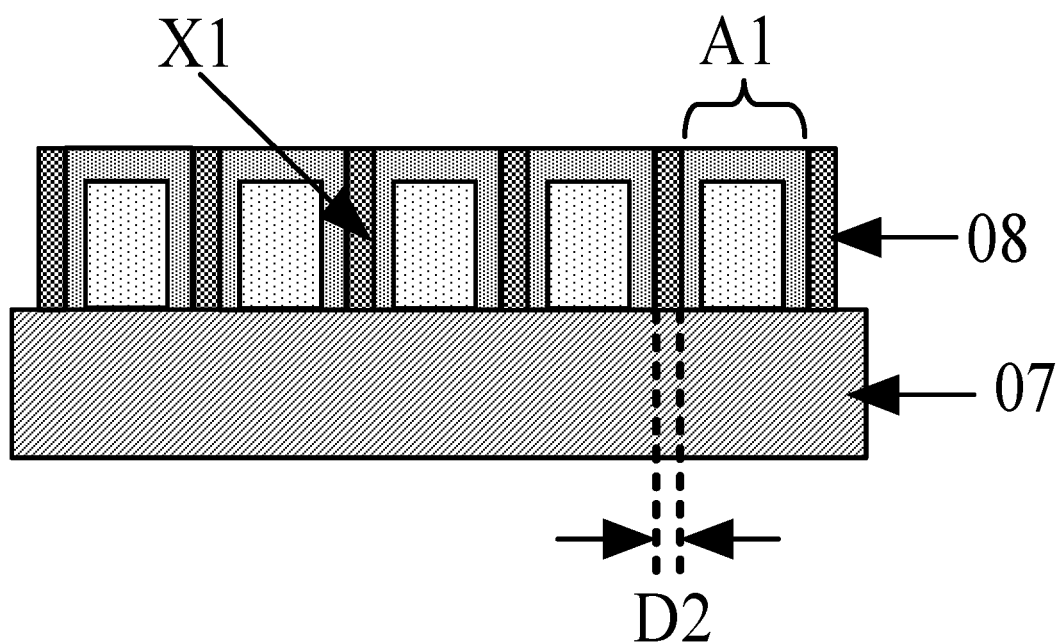
FIG. 10 is a schematic structural diagram of a light bar according to an embodiment of the present disclosure.

Exemplarily, during formation of one of the j light bars, still referring to FIG. 9, an isolation adhesive may be injected onto the printed circuit board 07 to form an insulating isolation structure 08 as illustrated in FIG. 10 on the printed circuit board 07. The isolation structure 08 may isolate any two adjacent light emitting units A1 on the printed circuit board 07. Optionally, the material of the isolation structure 08 may include silica gel or titanium dioxide, and a ratio of the content of the silica gel to the content of titanium dioxide may be 1:1. Optionally, the material of the isolation structure 08 may also include other materials. When the material of the isolation structure 08 include silica gel and titanium dioxide, the ratio of the content of the silica gel to the content of titanium dioxide may also be another value (for example, 1:2), which is not limited in the embodiment of the present disclosure.

Still referring to FIG. 10, a spacing D2 between any two light emitting units A1 in each light bar B1 may be less than or equal to 0.3 mm. Since the spacing D2 between any two light emitting units A1 in each light bar B1 is small, the case where the luminescent effect of the light bar B1 is affected because the spacing D2 between any two light emitting units A1 is too large during the process of emitting light by a plurality of light emitting units A1 in the light bar B1 is prevented. Optionally, the spacing D2 between any two light emitting units in each light bar B1 may also be less than or equal to another distance (for example, 0.25 mm), which is not limited in the embodiment of the present disclosure.

Optionally, a surface (not illustrated in FIG. 10) of the isolation structure 08 facing towards any light emitting unit A1 may be a reflection surface. When the light emitting units A1 in the light bar B1 emit light, the reflection surface is capable of reflecting a portion of the light emitted by the light emitting units A1 to the reflection surface to the light emitting units A1, such that the light emission amount of the light bar B1 increases.

It should be noted that the embodiment of the present disclosure is described only by taking an example where in the light bar B1 fabricated by the method for fabricating the light bar, the surface of any light emitting unit facing towards the other light emitting units is perpendicular to the printed circuit board. In this case, in each light bar B1, a surface of the isolation structure 08 facing towards any light emitting unit A1 is perpendicular to the printed circuit board. The other light emitting units include the light emitting units other than the any light emitting unit A1 in the light bar B1. Optionally, in the light bar fabricated by using the method for fabricating the light bar, the surface of the isolation structure facing towards any light emitting unit may also be not perpendicular to the printed circuit board.

Figure 11:
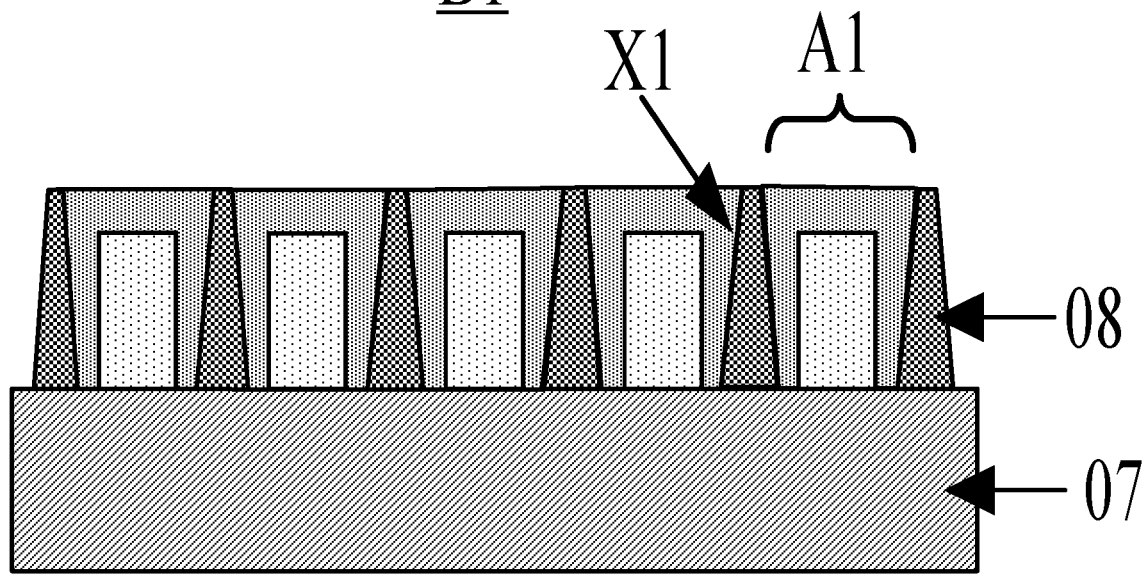
FIG. 11 is a schematic structural diagram of another light bar according to an embodiment of the present disclosure.

Exemplarily, FIG. 11 is a schematic structural diagram of another light bar according to an embodiment of the present disclosure. As illustrated in FIG. 11, in the light bar B1, the surface (that is, the reflection surface) of the isolation structure 08 facing towards any light emitting unit A1 may also be not perpendicular to the printed circuit board 07. In this case, an included angle between the surface of the any light emitting unit A1 facing the other light emitting units and the printed circuit board 07 may be less than 90 degrees. Optionally, the surface (that is, the above reflection surface) of the any light emitting unit A1 facing the other light emitting units may also face towards a direction away from the printed circuit board 07. When the light emitting units A1 in the light bar B1 emit light, the reflection surface facing towards the direction away from the printed circuit board 07 is capable of reflecting more of the light emitted by the light emitting units A1 to the reflection surface to sides of the light emitting units A1 away from the printed circuit board 07, such that the light emission amount of the light bar B1 further increases.

Figure 12:
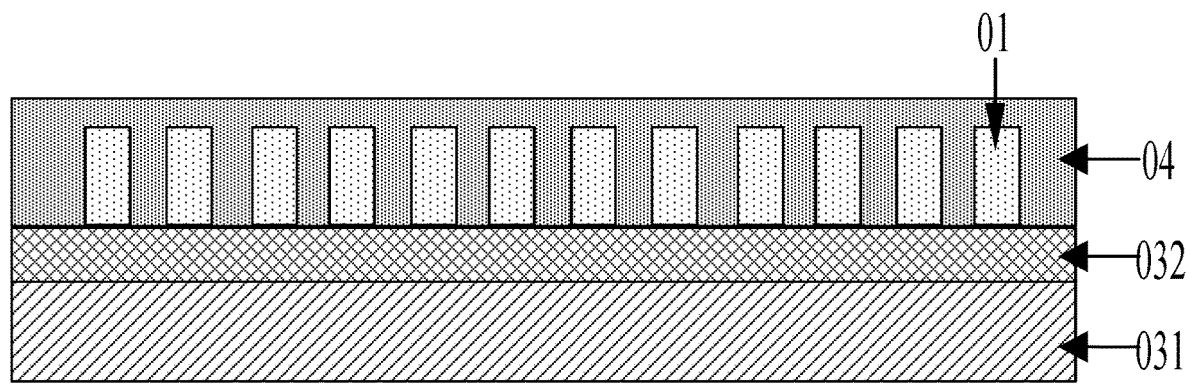
FIG. 12 is a schematic structural diagram of another initial structure according to an embodiment of the present disclosure.
Figure 13:
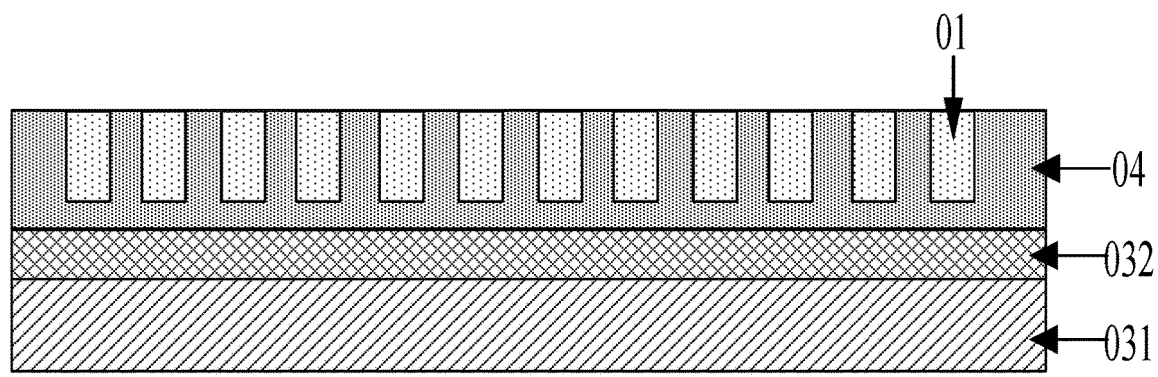
FIG. 13 is a schematic structural diagram of a rotated initial structure according to an embodiment of the present disclosure.
Figure 14:
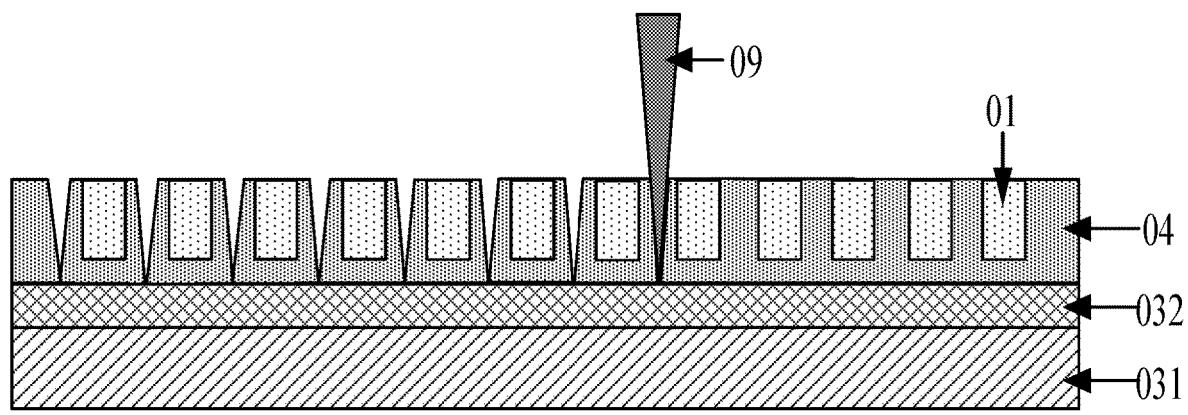
FIG. 14 is a schematic diagram of another positional relationship between the cutting tool and the initial structure according to an embodiment of the present disclosure.
Figure 15:
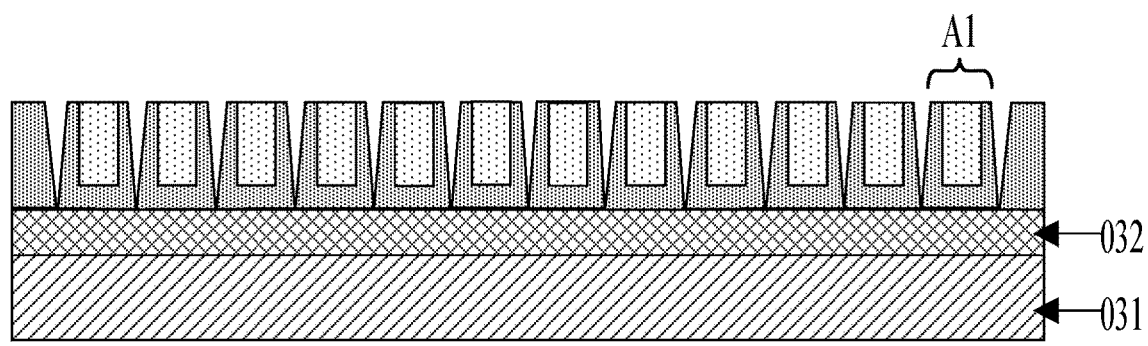
FIG. 15 is a schematic diagram of another positional relationship between the substrate and the plurality of light emitting units according to an embodiment of the present disclosure.

During the fabrication of the light bar B1 as illustrated in FIG. 11, in step 2011, when the plurality of light beads are transferred from the blue film to the substrate where the thermally-conductive adhesive tape is disposed, the plurality of light beads may be spaced apart from each other on the thermally-conductive adhesive tape, and then the fluorescent layer 04 covering the plurality of light beads 01 as illustrated in FIG. 12 is formed on the thermally-conductive adhesive tape to form the initial structure. Subsequently, in step 2012, during the process of cutting the initial structure into a plurality of light emitting units, as illustrated in FIG. 13, the initial structure on the substrate 03 may be rotated first, such that the fluorescent layer 04 in the initial structure is near the substrate 03. Afterwards, as illustrated in FIG. 14, the rotated initial structure may be cut into a plurality of light emitting units by using a cutting tool 09. The cutting tool 09 is in a sheet shape, and the thickness of the cutting tool 09 progressively increases in a direction from a cutting edge to a spin of the cutting tool, such that the rotated initial structure is cut into a plurality of light emitting units A1 having a trapezoid-shaped cross section as illustrated in FIG. 15. It should be noted that the embodiment of the present disclosure is described only by taking an example where the cutting tool 09 is a sheet-shaped cutting tool whose cross section is in an inverted triangular shape. Optionally, the cutting tool 09 may be a sheet-shaped cutting tool whose cross section is in another shape (for example, an inverted trapezoid shape or an inverted clock shape), which is not limited in the embodiment of the present disclosure.

Figure 16:
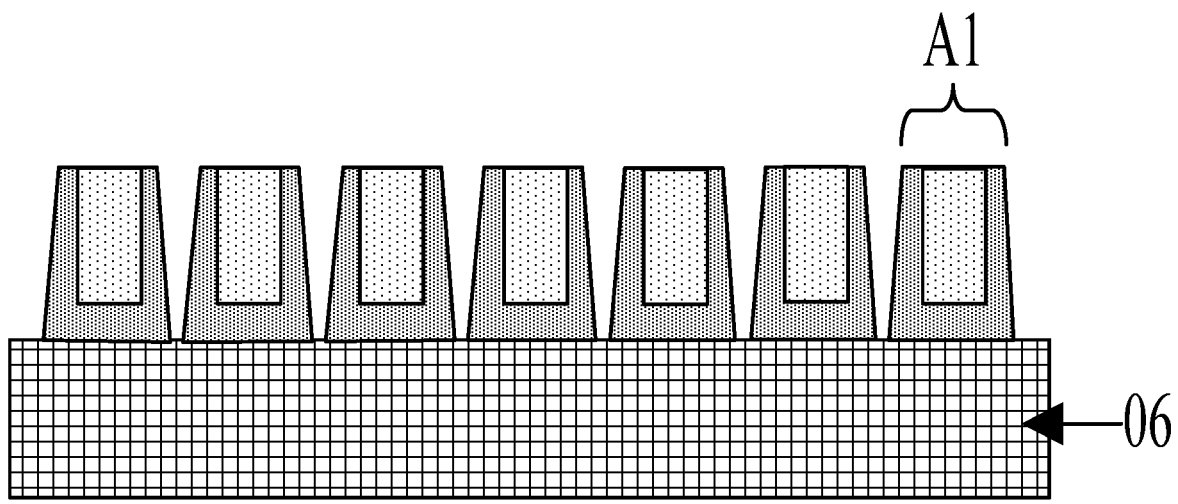
FIG. 16 is a schematic diagram of another positional relationship between the blue film and the plurality of light emitting units according to an embodiment of the present disclosure.
Figure 17:
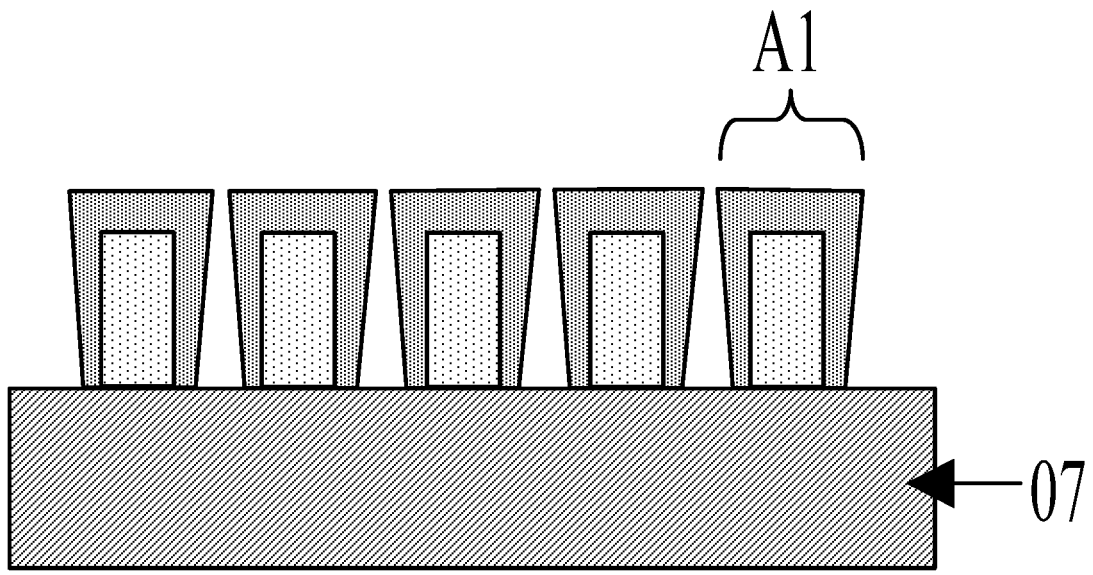
FIG. 17 is a schematic diagram of structures of the printed circuit board and the plurality of light emitting units according to an embodiment of the present disclosure.

In step 205, during the process of disposing the m groups of light emitting units determined in step 203 on the j printed circuit boards to obtain the j light bars, the m groups of light emitting units may be rotated and disposed on the j printed circuit boards to obtain the j light bars. The light beads in each light bar are close to the printed circuit board. Exemplarily, when the plurality of light emitting units in each group of light emitting units of the m groups of light emitting units are disposed on a printed circuit board of the j printed circuit boards, still referring to FIG. 15, these light emitting units A1 may be first transferred from the substrate 03 to the blue film 06 as illustrated in FIG. 16, and subsequently these light emitting units A1 are rotated and transferred from the blue film 06 to the printed circuit board 07 as illustrated in FIG. 17, such that the light bead in each light emitting unit A1 is close to the printed circuit board 07. Finally, in step 206, an isolation adhesive may be injected onto the printed circuit board 07 to form the isolation structure 08 as shown in FIG. 11 with a surface, close to any light emitting unit A1, facing towards the direction away from the printed circuit board 07 on the substrate.

It should be noted that method for fabricating the light bar according to the embodiment of the present disclosure is described only by taking an example where the plurality of light emitting units formed on the printed circuit board in step 205 are spaced apart from each other, and the isolation structure configured to isolate any two adjacent light emitting units is formed on each printed circuit board in step 206. Optionally, in the plurality of light emitting units formed on the printed circuit board in step 205, any two adjacent light emitting units may be in contact with each other, and step 206 may be omitted.

Figure 18:
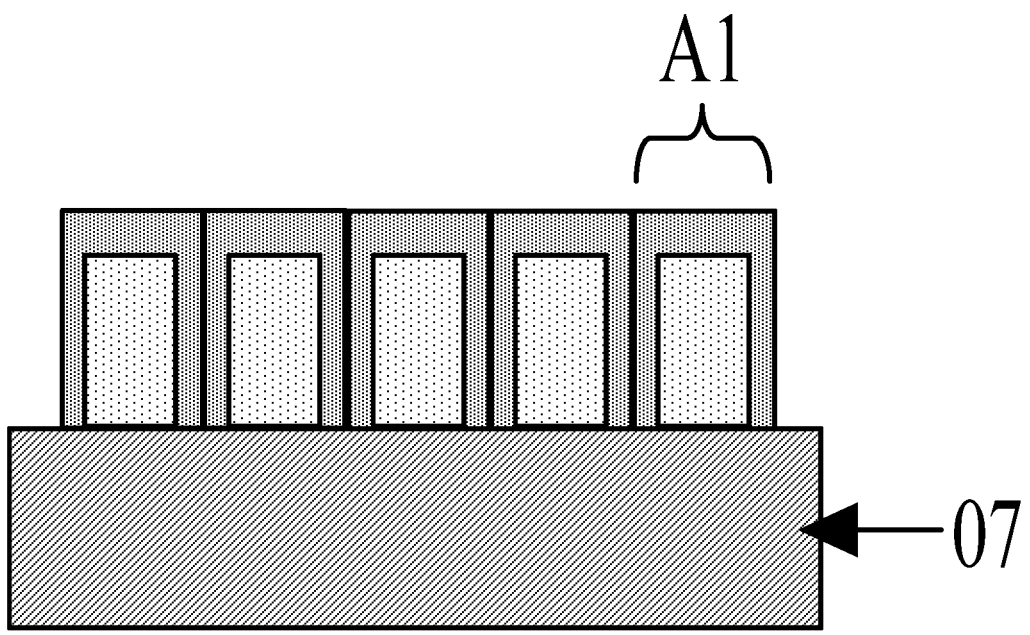
FIG. 18 is a schematic structural diagram of yet another light bar according to an embodiment of the present disclosure.

Exemplarily, FIG. 18 is a schematic structural diagram of still another light bar according to an embodiment of the present disclosure. As illustrated in FIG. 18, any two adjacent light emitting units A1 on the printed circuit board 07 in the light bar B1 may be in contact with each other. That is, the isolation structure configured to isolate any two adjacent light emitting units A1 does not need to be formed on the printed circuit board 07.

In summary, during fabrication of a light bar in the related art, after a plurality of light emitting units are fabricated, the plurality of light emitting units are directly disposed on a printed circuit board, without selecting a target group of light emitting units from the plurality of light emitting units based on the luminescent characteristics of the plurality of light emitting units. However, in the method according to the embodiment of the present disclosure, after a plurality of light emitting units are fabricated, a target group of light emitting units are determined based on the luminescent characteristics of the plurality of light emitting units. In this way, the fabricating method according to the present disclosure is different from the fabricating method in the related art, which enriches the methods for fabricating light bars.

In addition, when the target group of light emitting units satisfy the condition $|P1_i-P2_i|\leq Q_i$, light emitted by the light emitting units in the target group of light emitting units has a small difference. Therefore, after a plurality of light emitting units in the target group of light emitting units are disposed on a printed circuit board, light emitted by any two light emitting units on one printed circuit board has a small difference, and thus the light bar where the printed circuit board is achieves a better luminescence effect.

In addition, the structure of the light bar according to the embodiment of the present disclosure may also be referenced to as a chip on board (COB) structure. When the light bar is applied to a side-type backlight source in a display apparatus, the spacing between the light bar and the display panel in the display apparatus is relatively small (for example, the spacing is about 1.0 mm), such that a narrow-frame display apparatus may be achieved.

An embodiment of the present disclosure further provides a light bar. The light bar may be obtained by using the method for preparing the light bar as described above. For example, the light bar may be the light bar as illustrated in any one of FIG. 10, FIG. 11 and FIG. 18.

Exemplarily, as illustrated in FIG. 10, the light bar B1 includes a printed circuit board 07, and at least two light emitting units A1 on the printed circuit board 07.

The at least two light emitting units satisfy $|P1_i-P2_i|\leq Q_i$. Here, $P1_i$ denotes an $i^{th}$ parameter in n parameters that a light emitting unit A1 in the light bar corresponds to, $1\leq i \leq n$, $P2_i$ denotes an $i^{th}$ parameter in parameters that another light emitting unit A1 in the light bar corresponds to, and $Q_i$ denotes a threshold of the $i^{th}$ parameter. The n parameters that the light emitting unit A1 corresponds to includes: at least one parameter of light emitted by at least one target structure under a target voltage. The target structure includes at least one light emitting portion in the light emitting unit A1.

In summary, in the light bar fabricated by using the method for fabricating the light bar according to the embodiment of the present disclosure, at least two light emitting units satisfy the condition $|P1_i-P2_i|\leq Q_i$. Therefore, light emitted by the at least two light emitting units has a small difference. Therefore, the light emitted by any two light emitting units in the light bar has a small difference, and the luminescent effect of the light bar is good.

Optionally, the base material of the printed circuit board may include BT resin, or polyimide (PI).

Optionally, the n parameters include at least one of chrominance, luminance and wavelength band. The embodiment of the present disclosure is described by taking an example where the n parameters include the chrominance, luminance and wavelength band.

Optionally, the light emitting unit A1 may include a light bead 01 and a fluorescent film 041 covering the light bead 01. The light bead 01 and the fluorescent film 041 are both the light emitting portions of the light emitting unit A1. The above-described at least one target structure includes a first target structure including the light bead 01 and the fluorescent film 041, and a second target structure including the light bead 01. In this case, the n parameters that the light emitting unit A1 corresponds to include chrominance and luminance of the light emitted by the first target structure under a target voltage, and wavelength band of the light emitted by the first target structure or the second target structure under the target voltage.

Optionally, still referring to FIG. 10, a spacing D2 between any two light emitting units A1 in each light bar B1 may be less than or equal to 0.3 mm. In this case, since the spacing D2 between any two light emitting units A1 in each light bar B1 is small, the case where the luminescent effect of the light bar B1 is affected because the spacing D2 between any two light emitting units A1 is too large during the process of emitting light by a plurality of light emitting units A1 in the light bar B1 is prevented.

Optionally, as illustrated in FIG. 10, a surface X1 of any light emitting unit A1 in the light bar B1 facing towards other light emitting units is perpendicular to the printed circuit board 07, and the other light emitting units include the light emitting units other than the any light emitting unit in the light bar B1. Alternatively, as illustrated in FIG. 11, in the light bar B1, an included angle between the surface X1 of the any light emitting unit A1 facing the other light emitting units and the printed circuit board 07 may be less than 90 degrees.

Optionally, referring to FIG. 11, when the included angle between the surface X1 of the any light emitting unit A1 in the light bar B1 facing the other light emitting units and the printed circuit board 07 is less than 90 degrees, the surface X1 of the any light emitting unit A1 facing the other light emitting units in the light bar B1 faces towards a direction away from the printed circuit board 07. In this case, a surface of an isolation structure 010 in the light bar B1 facing towards any light emitting unit A1 may face towards the direction away from the printed circuit board 07.

Optionally, in the light bar, the surface (the surface X1 as illustrated in FIG. 10 and FIG. 11) of the isolation structure facing towards any light emitting unit is a reflection surface.

Optionally, still referring to FIG. 10, the light bar B1 may include a printed circuit board 07, and a plurality of light emitting units A1 and isolation structures 08 on the printed circuit board 07. The plurality of light emitting units A1 are arranged in sequence, and the isolation structure is insulating and isolates any two adjacent light emitting units A1.

Optionally, the material of the isolation structure may include at least one of silica gel and titanium dioxide. The embodiment of the present disclosure is described by taking an example where the material of the isolation structure includes silica gel and titanium dioxide.

The embodiment of the present disclosure is described by taking an example where the plurality of light emitting units in the light bar are spaced apart from each other. Optionally, referring to FIG. 18, any two adjacent light emitting units A1 on the printed circuit board 07 in the light bar B1 may be in contact with each other.

In summary, in the light bar fabricated by using the method for fabricating the light bar according to the embodiment of the present disclosure, at least two light emitting units satisfy the condition $|P1_i-P2_i|\leq Q_i$. Therefore, light emitted by the at least two light emitting units has a small difference. Therefore, the light emitted by any two light emitting units in the light bar has a small difference, and the luminescent effect of the light bar is good.

An embodiment of the present disclosure further provides a display apparatus. The display apparatus may include the light bar according to the embodiment of the present disclosure, for example, the light bar as illustrated in any one of FIG. 10, FIG. 11 and FIG. 16.

Exemplarily, the display apparatus may be a liquid crystal panel, an electronic paper, a mobile phone, a tablet computer, a television, a display, a laptop computer, a digital photo frame, a navigator or the like product or part having the display function.

It should be noted that the embodiments of the fabricating method, the embodiments of the light bar, and the embodiment of the display apparatus of the present disclosure may be cross referenced, which is not limited in the embodiments of the present disclosure. The sequence of the steps in the method embodiments may be adjusted appropriately, and the steps may be deleted or added according to the situation. Within the technical scope disclosed in the present disclosure, any variations of the method easily derived by a person of ordinary skill in the art shall fall within the protection scope of the present disclosure, which is not repeated here.

Other embodiments of the present disclosure will be apparent to those skilled in the art from consideration of the specification and practice of the present disclosure. This application is intended to cover any variations, uses, or adaptations of the present disclosure following the general principles thereof and including common knowledge or commonly used technical measures which are not disclosed herein. The specification and embodiments are to be considered as illustrative only, and the true scope and spirit of the present disclosure are indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. A method for fabricating a light bar, comprising:
fabricating a plurality of light emitting units, comprising:
   forming a plurality of light beads on a blue film;
   transferring the plurality of light beads on the blue film to a substrate where a thermally-conductive adhesive tape is disposed, the plurality of light beads being spaced apart from each other on the substrate;
   forming an initial structure on the substrate by injecting fluorescent melt onto the plurality of light beads and thermally curing the fluorescent melt to form a fluorescent layer, wherein the initial structure comprises the plurality of light beads that are spaced apart from each other and the fluorescent layer covering the plurality of light beads; and
   cutting the initial structure into the plurality of light emitting units, wherein each of the plurality of the light emitting units comprises one of the light beads and a fluorescent film, the fluorescent film comprising a portion, covering the one light bead, of the fluorescent layer, the light bead and the fluorescent film being both light emitting portions in the light emitting unit;
determining a target group of light emitting units in the plurality of light emitting units based on luminescent characteristics of the plurality of light emitting units, the target group of light emitting units comprising a portion of light emitting units in the plurality of light emitting units;
the target group of light emitting units satisfy: $|P1_i-P2_i|\leq Q_i$, $P1_i$ denoting an $i^{th}$ parameter in n parameters that one light emitting unit in the target group of light emitting units corresponds to, $1\leq i\leq n$, $P2_i$ denoting an $i^{th}$ parameter in n parameters that another light emitting unit in the target group of light emitting units corresponds to, and $Q_i$ denoting a threshold of the $i^{th}$ parameter; and
the n parameters that the light emitting unit corresponds to comprise: chrominance, luminance and wavelength of light emitted by a first target structure under the target voltage, and the first target structure comprises the light bead and the fluorescent film, wherein a threshold of the chrominance is 0.005, and a threshold of the luminance is 0.25;
providing j printed circuit boards;
disposing the plurality of light emitting units in each group of light emitting units in the target group of light emitting units on one printed circuit board in the j printed circuit boards; and
forming an isolation structure configured to isolate any two adjacent light emitting units on each of the j printed circuit boards to form j light bars, wherein the isolation structure comprises silica gel and titanium dioxide, and a surface of the isolation structure facing towards any light emitting unit is a reflection surface.

2. The method according to claim 1, wherein the forming an initial structure on a substrate comprises:
forming the plurality of light beads on the substrate;
injecting fluorescent melt on a side where the plurality of light beads are on the substrate; and
thermally curing the fluorescent melt to form the fluorescent layer;

wherein the substrate comprises a substrate body and a thermally-conductive adhesive tape that are superimposed, the plurality of light beads being on a side of the thermally-conductive adhesive tape away from the substrate body.

3. The method according to claim 1, wherein an included angle between a surface of any light emitting unit facing towards other light emitting units and the printed circuit board is less than 90 degrees, the other light emitting units comprising light emitting units in the light bar other than the any light emitting unit.

4. The method according to claim 3, wherein cutting the initial structure into the plurality of light emitting units comprises:
rotating the initial structure on the substrate such that a fluorescent film in the initial structure is near the substrate; and
cutting the rotated initial structure into the plurality of light emitting units with a cutting tool, the cutting tool being in a sheet shape, and the cutting tool having a progressively increasing thickness in a direction from a cutting edge to a spin of the cutting tool; and the disposing at least two light emitting units in the target group of light emitting units on a printed circuit board to obtain a light bar comprises:
rotarily disposing the at least two light emitting units in the target group of light emitting units the printed circuit board to obtain the light bar, the light beads in the light bar being near the printed circuit boards.

5. The method according to claim 1, wherein the fabricating a plurality of light emitting units comprises:
forming a plurality of light beads on a substrate, the substrate comprising a substrate body and a thermally-conductive adhesive tape that are superimposed, and the plurality of light beads being on a side of the thermally-conductive adhesive tape away from the substrate body;
injecting fluorescent melt on a side where the plurality of light beads are on the substrate;
thermally curing the fluorescent melt to form a fluorescent layer covering the plurality of light beads; and
cutting the initial structure into the plurality of light emitting units.

\* \* \* \* \*